United States Patent [19]

Abramovici et al.

[11] Patent Number: 5,831,996
[45] Date of Patent: Nov. 3, 1998

[54] DIGITAL CIRCUIT TEST GENERATOR

[75] Inventors: Miron Abramovici, Union, N.J.;
Daniel Saab, University Heights, Ohio

[73] Assignee: Lucent Technologies Inc., Murray Hill, N.J.

[21] Appl. No.: 801,239

[22] Filed: Feb. 19, 1997

Related U.S. Application Data

[60] Provisional application No. 60/028,282 Oct. 10, 1996.
[51] Int. Cl.[6] ................................................ G06F 11/00
[52] U.S. Cl. ........................................ 371/27.1; 364/578
[58] Field of Search ................................ 371/27.1, 27.4, 371/22.2, 27.2; 395/500, 183.13, 183.07, 180, 183.01, 185.01; 364/488, 489, 578, 550, 718, 580

[56] References Cited

U.S. PATENT DOCUMENTS

| 4,204,633 | 5/1980 | Goel . | |
|---|---|---|---|
| 5,377,197 | 12/1994 | Patel et al. | 371/23 |
| 5,475,624 | 12/1995 | West | 364/578 |
| 5,502,729 | 3/1996 | Nakata | 371/22.3 |
| 5,566,187 | 10/1996 | Abramovici et al. | 371/22.1 |
| 5,602,856 | 2/1997 | Teramoto | 371/27 |
| 5,604,840 | 2/1997 | Asai et al. | 395/11 |
| 5,633,813 | 5/1997 | Srinivasan | 364/578 |

OTHER PUBLICATIONS

F. Hirose, K. Takayama, and N.Kawato, "A Method to Generate Tests for Combinational Logic Circuits using an Ultrahigh–speed Logic Simulator," 1988 International Test Conference, paper 5.3, pp. 102–107. (1988).
H. Fujiwara and T. Shimono, "On the Acceleration of Test Generation Algorithms," IEEE Transactions on Computers, v. c–32, No. 12, pp. 1137–1144 (1983).
K. Cheng, S. Huang and W. Dai, "Fault Emulation: A New Approach to Fault Grading." PROC. ICCAD, pp. 681–686, Nov. 1995.

Primary Examiner—Robert W. Beausoliel, Jr.
Assistant Examiner—Nadeem Iqbal

[57] ABSTRACT

Automatic test pattern generator for generating test patterns that are capable of detecting faults in a digital combinational circuit comprises a first forward network capable of emulating the digital combinational circuit; a second forward network capable of emulating the digital combinational circuit in the presence of any one target fault from a specified set of faults, and receiving a set of control signals for selecting the target fault; a first backward network having one primary input for every primary output of the digital combinational circuit and one primary output for every primary input of the digital combinational circuit, the first backward network generating one fault activation objective corresponding to the selected target fault, and receiving first signal values computed in the first forward network for propagating the fault activation objective towards a primary output; a second backward network having one primary input for every primary output of the digital combinational circuit and one primary output for every primary input of the digital combinational circuit, the second backward network receiving second signal values computed in the second forward network for propagating the fault activation objective towards a primary output, both the first and second backward networks independently generating and propagating fault-effect propagation objectives towards one or more of its respective primary outputs; a first control device for generating the set of control signals corresponding to a target fault, and selecting the target fault one at a time from the specified set of target faults; means for merging one or more objectives propagated to the primary outputs of the first and second backward network; comparator device for comparing the first and second sets of primary output signals from each the first and second forward network in response to primary input signals, and determining whether at least one pair of corresponding primary outputs have different binary values and providing an output therefor; and, second control device for receiving the merged objectives from the backward network and the comparator output, and determining therefrom primary input values of the first and second forward network for detecting the target fault in the combinational digital circuit.

22 Claims, 12 Drawing Sheets

FIG. 7A
| VALUE | CODE | |
|---|---|---|
| A | $A_0$ | $A_1$ |
| 0 | 1 | 0 |
| 1 | 0 | 1 |
| x | 1 | 1 |
FIG. 7B
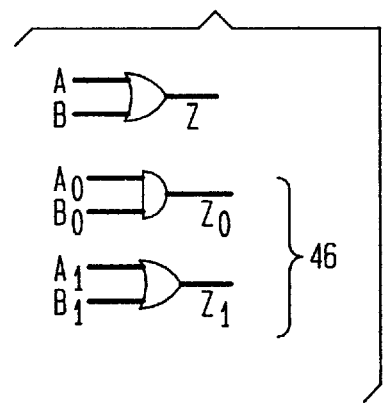
FIG. 7C
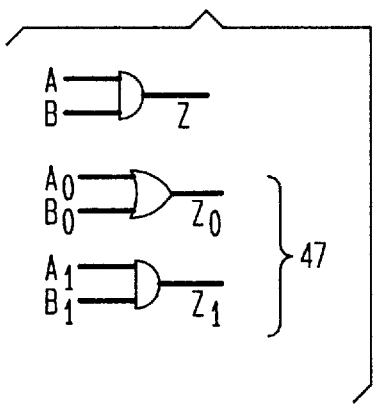
FIG. 8A
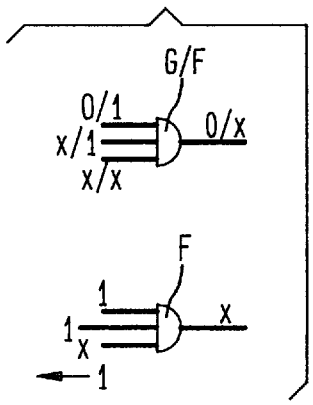
FIG. 8B
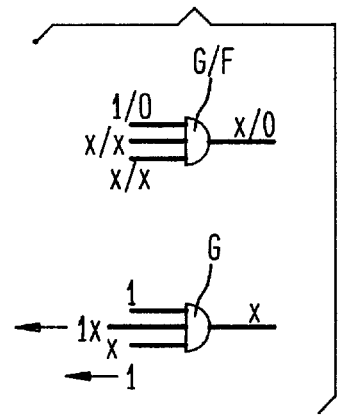

FIG. 9A
| OBJECTIVE | FLAG | VALUE |
|---|---|---|
| φ (NONE) | 0 | - |
| 0 | 1 | 0 |
| 1 | 1 | 1 |
FIG. 9B
| OBJECTIVE | FLAG | VALUE |
|---|---|---|
| φ (NONE NOW) | 0 | 0 |
| θ (USELESS) | 0 | 1 |
| 0 | 1 | 0 |
| 1 | 1 | 1 |
FIG. 10A
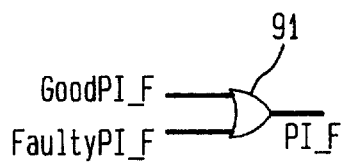
FIG. 10B
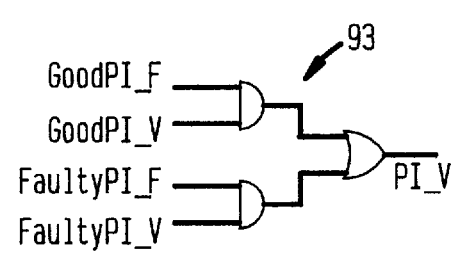
FIG. 11A
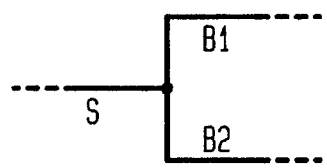
FIG. 11B
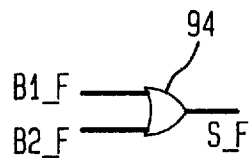
FIG. 11C
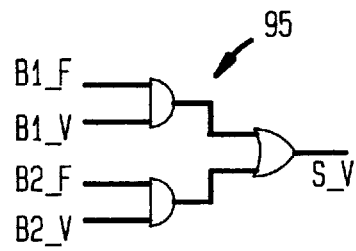

FIG. 12A

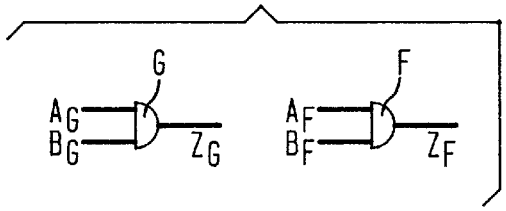

FIG. 12B

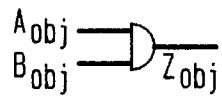

FIG. 13A

| $Z_G$ | $Z_{obj}$ | $Z_F$ | $A_G$ | $B_G$ | $A_{obj}$ | $B_{obj}$ | |
|---|---|---|---|---|---|---|---|
| 0, 1 | - | - | - | - | ∅ | ∅ | OUTPUT BINARY — 96 |
| x | 1 | - | x | x | 1 | 1 | PROPAGATE 1 OBJECTIVE |
| | | | 1 | | ∅ | 1 | |
| | 0 | | x | | 0 | ∅ | PROPAGATE 0 OBJECTIVE |
| | | | 1 | | ∅ | 0 | |
| x | ∅ | x | - | - | ∅ | ∅ | NO OUTPUT OBJECTIVE — 98 |
| | | 0 | x | x | 1 | 1 | GENERATE PROPAGATION OBJECTIVE |
| | | | 1 | x | ∅ | 1 | |

{97 for PROPAGATE rows}
{99 for GENERATE rows}

FIG. 13B

| $Z_G$ | $Z_{obj}$ | $Z_F$ | $A_G$ | $B_G$ | $A_{obj}$ | $B_{obj}$ | |
|---|---|---|---|---|---|---|---|
| 0, 1 | - | - | - | - | θ | θ | OUTPUT BINARY |
| x | θ | - | - | - | | | OUTPUT DEAD |
| - | - | - | 1 | - | θ | - | ONE INPUT BINARY |
| - | - | - | - | 1 | - | θ | |
| x | 1 | - | x | x | 1 | 1 | PROPAGATE 1-OBJECTIVE |
| | | | 1 | | θ | 1 | |
| | 0 | | x | | 0 | ∅ | PROPAGATE 0-OBJECTIVE |
| | | | 1 | | θ | 0 | |
| x | ∅ | x | x | x | ∅ | ∅ | NO OUTPUT OBJECTIVE |
| | | 0 | x | x | 1 | 1 | GENERATE PROPAGATION OBJECTIVES |
| | | | 1 | | θ | 1 | |

| $B1_{obj}$ | $B2_{obj}$ | $S_{obj}$ | |
|---|---|---|---|
| $\emptyset$ | $\emptyset$ | $\emptyset$ | NO OBJECTIVE |
| $\emptyset$ | 0, 1 | 0, 1 | ONE OBJECTIVE |
| 0 | 0 | 0 | SAME OBJECTIVES |
| 1 | 1 | 1 | |
| 0 | 1 | 1 | CONFLICTING OBJECTIVES (USE MAJORITY VOTING) |
| 1 | 0 | 1 | |

FIG. 14B

| $B1_{obj}$ | $B2_{obj}$ | $S_{obj}$ | |
|---|---|---|---|
| $\emptyset$ | $\emptyset, \theta$ | $\emptyset$ | |
| $\emptyset, \theta$ | $\emptyset$ | $\emptyset$ | NO OBJECTIVES |
| $\theta$ | $\theta$ | $\theta$ | |
| $\emptyset, \theta$ | 0, 1 | 0, 1 | ONE OBJECTIVE |
| 0, 1 | $\emptyset, \theta$ | 0, 1 | |
| 0 | 0 | 0 | SAME OBJECTIVES |
| 1 | 1 | 1 | |
| 0 | 1 | 1 | CONFLICTING OBJECTIVES (USE MAJORITY VOTING) |
| 1 | 0 | 1 | |

FIG. 15

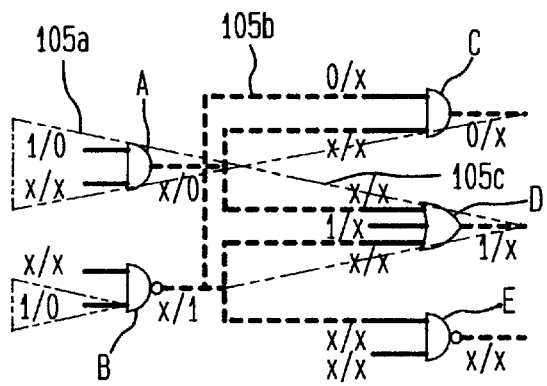

DIGITAL CIRCUIT TEST GENERATOR

RELATED APPLICATIONS

This application claims the benefit of provisional U.S. patent application Ser. No. 60/028,232 filed Oct. 10, 1996.

FIELD OF THE INVENTION

The present invention relates generally to the field of automatic test-pattern generation (ATPG) for digital combinational logic circuits and, more particularly, to a high-speed, hardware-implemented approach for generating stimuli to detect faults in such circuits and, a hardware-based satisfiability circuit capable of generating a vector of input signals for such circuits that will produce a predetermined output signal.

BACKGROUND OF THE INVENTION

The problem of adequately testing digital logic circuits has grown substantially more complex over the years with the rapid increase in the complexity of the logic circuits being designed and fabricated. Most modern approaches to this problem involve the use of automatic test-pattern generation (ATPG) systems which are charged with the task of automatically generating a comprehensive test plan for a given circuit design. Such an ATPG system is provided with a description of the circuit design, typically in terms of its constituent circuit elements (e.g., logic gates) and the interconnections among those elements and to the circuit's primary inputs and primary outputs. The ATPG system then automatically generates circuit stimuli which, when applied to the primary inputs of a fabricated instance of the given circuit design, will result in a response at the circuit's primary outputs which will identify (with a reasonable degree of certainty) whether the fabricated circuit is operating in accordance with the given circuit design.

Since the number of possible malfunctions which a fabricated circuit may theoretically exhibit is extremely large, ATPG systems typically perform their task (and measure the quality of their result) based on a "fault model" in which only a comparatively small number possible malfunctions are considered. The most common such model, the "stuck-at" fault model, enumerates the set of malfunctions in which each circuit lead (i.e., each input to and each output from a circuit element) may be individually "stuck" at one of its possible values (e.g., logic 0 or logic 1). In this manner, the number of possible faults to be considered is limited to twice the number of circuit leads. The "stuck-at" fault model has become well accepted as providing a reasonable correspondence to the set of likely physical errors which typically result from the fabrication process.

Most ATPG systems select one of the modeled faults at a time, and attempt to generate tests (i.e., circuit stimuli) which will be able to "detect" that fault. That is, the system's goal is to find circuit stimuli which, when applied to the primary inputs of a "defective" circuit (i.e., one which has the given fault), will result in a response at the circuit's primary outputs which differs from that of a properly operational circuit. Usually, these circuit stimuli are generated as a result of an exhaustive search procedure involving substantial trial and error. Software procedures implementing ATPG algorithms are characterized by extremely long run times. Using hardware specially designed for ATPG would be desirable to provide a much needed speed up.

For instance, FIG. 1 illustrates a simple, hardware-based approach for creating an "ATPG circuit" for a given combinational circuit and for a single target fault; the function of the ATPG circuit is to perform the ATPG task for the given circuit and the given fault. The faulty circuit 20 is a copy or emulation model of the fault free or "good" circuit 25, except that it also represents the effect of the target fault. The comparator 30 detects any difference between the primary output (PO) values of the two circuits, whose primary inputs (PIs) are fed by the same counter 27. When an error (fault effect) propagates to a PO, and is detected by the comparator 30, the Error@POs signal 32 is generated to stop the counter 27. At that point, the state of the counter output provides the vector 29 that has detected the target fault. If the counter 27 exhausts its range without any detection, the target fault is undetectable. This approach, based on explicit enumeration of all possible vectors, becomes too time-consuming and is not efficient when the number of PIs driven by the counter becomes larger than, e.g., twenty-four (the exact number depends on the clock rate of the ATPG circuit).

U.S. Pat. No. 5,475,624 to West involves the emulation of faulty circuit in a scheme similar to that described above with reference to FIG. 1. In this reference, however, the emulated faulty circuit is tested in the intended operating environment and receives only those vectors generated in the emulated operating environment of the circuit under test.

U.S. Pat. No. 4,204,633 to Goel describes a similar logic chip test system that utilizing a feedback mechanism and counter for iteratively determining sets of input signals for detecting stuck-at faults, largely in accordance with a Path-Oriented Decision Making ("PODEM") algorithm described in greater detail below.

In another hardware-based approach such as disclosed in the reference to F. Hirose, K. Takayama, and N. Kawato, entitled "A Method to Generate Tests for Combinational Logic Circuits Using an Ultrahigh-speed Logic Simulator," *Proc. ITC*, pp 102–107, October 1988, tests are generated for a given combinational circuit "C" by creating a model and simulating a new circuit "TG(C)" which generates tests for C. In addition to containing a model of C, TG(C) contains a fault-injection circuit and a circuit to generate input vectors. Tests are generated by simulating TG(C) on a multiprocessor simulation machine. The hardware mechanism generates 3-valued (0, 1, x) patterns, so that when the simulator determines that a partially specified vector having k unspecified (x) values cannot detect the target fault, all the $2^k$ vectors it represents are implicitly rejected at the same time. Although this enumeration is implicit, the primary input assignments are tried in a fixed order independent of the target fault. That is, if A is the first input, A=1 will always be tried first, even if A cannot influence the detection of the target fault (or even if A=0 is the only correct choice for the current target fault). This results in a lot of unnecessary backtracking, which makes running ATPG to completion too expensive. Also, simulating the ATPG hardware introduces another layer of indirection that reduces the efficiency of this scheme.

It would thus be desirable to provide a hardware-based ATPG implementation whose objective is to reduce the software ATPG run-times by several orders of magnitude, while achieving a fault coverage better than, or at least equal to, that obtained by current software ATPG implementations.

Since the ATPG circuit will be used only once, it would additionally be desirable to provide an implementation that exploits advantages of reconfigurable hardware to "virtually" construct the ATPG circuit. Reconfigurable hardware, based on Field-Programmable Gate Arrays (FPGAs) and Field-Programmable Interconnect Devices (FPIDs), can be repeatedly reused to implement different logic circuits. Typically the reconfiguration consists of reloading a Random-Access Memory (RAM) residing in, and determining the function of, a reconfigurable chip (FPGA or FPID).

SUMMARY OF THE INVENTION

The instant invention provides a hardware-based ATPG approach for generating tests for complex combinational digital logic circuits. Unlike software ATPG algorithms, which execute their instructions sequentially, the invention provides a large degree of parallelism, such that all operations are done between successive decision steps of a software algorithm are performed in in a single clock cycle in the ATPG hardware.

Thus, there is provided an automatic test pattern generator for generating test patterns that are capable of detecting faults in a digital combinational circuit, the automatic test pattern generator comprising a first forward network capable of emulating the digital combinational circuit; a second forward network capable of emulating the digital combinational circuit in the presence of any one target fault from a specified set of faults, and receiving a set of control signals for selecting the target fault; a first backward network having one primary input for every primary output of the digital combinational circuit and one primary output for every primary input of the digital combinational circuit, the first backward network generating one fault activation objective corresponding to the selected target fault, and receiving first signal values computed in the first forward network for propagating the fault activation objective towards a primary output; a second backward network having one primary input for every primary output of the digital combinational circuit and one primary output for every primary input of the digital combinational circuit, the second backward network receiving second signal values computed in the second forward network for propagating the fault activation objective towards a primary output, both the first and second backward networks independently generating and propagating fault-effect propagation objectives towards one or more of its respective primary outputs; a first control device for generating the set of control signals corresponding to a target fault, and selecting the target fault one at a time from the specified set of target faults; a device for merging one or more objectives propagated to the primary outputs of the first and second backward network; comparator device for comparing the first and second sets of primary output signals from each the first and second forward network in response to primary input signals, and determining whether at least one pair of corresponding primary outputs have different binary values and providing an output therefor; and, second control device for receiving the merged objectives from the backward network and the comparator output, and determining therefrom primary input values of the first and second forward network for detecting the target fault in the combinational digital circuit.

In a further embodiment of the invention, there is provided a hardware-based satisfiability circuit capable of detecting a vector of input signals that will generate a predetermined output signal of a modeled digital combinational circuit.

Advantageously, the hardware-based ATPG approach of the invention is implemented using reconfigurable hardware for emulating the ATPG circuit, the reconfigurable hardware can be reconfigured for emulating different circuits.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

BRIEF DESCRIPTION OF DRAWINGS

FIG. 4($b$) conceptually illustrates propagation of objectives in a backward network model of a circuit C.

FIG. 7($a$) illustrates the 3-valued logic coding used in the forward network model of combinational circuit.

FIG. 7($b$) illustrates the implementation of an OR gate in the forward network model of a combinational digital circuit.

FIG. 7($c$) illustrates the implementation of an AND gate in the forward network model of a combinational digital circuit.

FIGS. 8($a$) and 8($b$) illustrate the generation of fault-effect propagation objectives for an AND gate.

FIG. 9($a$) illustrates the objective coding table used for representing objectives in a first embodiment of the invention.

FIG. 9($b$) illustrates the objective coding table used for representing objectives in a second embodiment of the invention.

FIGS. 10($a$) and 10($b$) illustrate the mechanism for merging good and faulty objectives corresponding to objective coding used in the first embodiment according to the table of FIG. 9($a$).

FIG. 11($a$) illustrates fanout branches B1 and B2 of a stem S in a combinational digital circuit.

FIGS. 11($b$) and 11($c$) illustrate the mechanism for computing a stem objective given the objectives of its fanout branches B1 and B2 in a first embodiment of the invention.

FIG. 12($a$) illustrates a model of a 2-input AND gate in the good and faulty circuit models in the forward network.

FIG. 12($b$) illustrates the conceptual model for calculating objectives in the backward network model for the first 2-input AND gate of FIG. 12($a$).

FIG. 13($a$) illustrates the objective computation rules for a 2-input AND gate in the good circuit in accordance with the objective coding table of FIG. 8($a$) provided in one embodiment of the invention.

FIG. 13($b$) illustrates the objective computation rules for a 2-input AND gate in the good circuit in accordance with the objective coding table of FIG. 8($b$) provided in a preferred embodiment of the invention.

FIG. 14($a$) illustrates the truth table for implementing objective propagation on a stem given the objectives propagated in each of the branches in the first embodiment of the invention.

FIG. 14(b) illustrates the truth table for implementing objective propagation on a stem given the objectives propagated in each of the branches in the second embodiment of the invention.

FIG. 15 illustrates an example of dead areas in the good circuit.

DETAILED DESCRIPTION OF THE INVENTION

Figure 2:
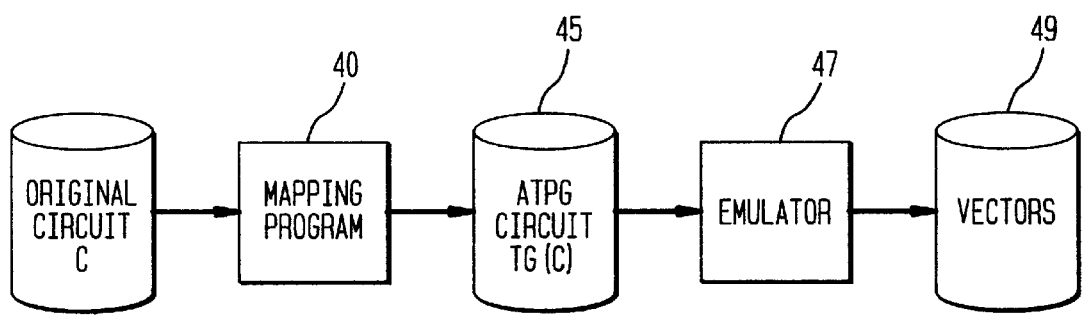
FIG. 2 illustrates a general data flow of the ATPG approach of the invention.

The instant invention is a hardware-based ATPG approach. FIG. 2 illustrates the data flow of the inventive hardware-based ATPG approach for testing complex digital circuitry. Generally, in the approach depicted in FIG. 2, the original digital combinational circuit C is processed by a mapping program 40 which generates the model of an ATPG circuit, labeled TG(C), 45. The ATPG circuit is then downloaded into the reconfigurable hardware 47. Preferably, an emulator such as Quickturn (See, RPM Emulation System Data Sheet, Quickturn Systems Inc., 1991) may be used as reconfigurable hardware, but other commercially available reconfigurable hardware may be used. The vectors 49 that detect the faults in the circuit C are generated by emulating the ATPG circuit TG(C). In contrast to a simulation accelerator where the same special-purpose hardware processes different circuits, the ATPG circuit is specifically designed only for the original circuit C. The hardware-based ATPG approach of the invention exploits the advantages of utilizing reconfigurable hardware by generating a different ATPG circuit for every processed circuit. The ATPG circuit is an autonomous synchronous circuit which does not require external stimuli.

The decision process is conceptually similar to existing ATPG algorithms, however, a preferred ATPG algorithm, the PODEM ("Path-Oriented Decision Making") algorithm, such as described in detail in P. Goel, "An Implicit Enumeration Algorithm to Generate Tests for Combinational Logic Circuits," *IEEE Trans. on Computers*, Vol. C-30, No. 3, pp. 215–222, March, 1981, incorporated by reference as if fully described herein, utilizes an efficient implicit enumeration scheme that incorporates a backtracing mechanism that is attractive for a reconfigurable hardware implementation, and, the FAN ("Fan-out-Oriented") test generation algorithm, such as described in H. Fujiwara, "On the Acceleration of Test Generation Algorithms," *IEEE Trans. on Computers*, Vol. C-32, No. 12, pp. 1137–1144, December 1983, also incorporated by reference as if fully set forth herein, implements an improved and more efficient backtracing machanism than the PODEM algorithm.

Central to PODEM and FAN is the concept of objective, which is a desired assignment l=v of value v to line l, which currently has an unknown value x. Initially all lines are set to x. Objectives are generated one at a time to activate the target fault, and then to propagate a fault effect to a primary output. For example, to activate a stuck-at-0 fault on a line A, the objective is to set A to value 1. An objective may be achieved only by primary input assignments. A software implemented backtracing mechanism propagates the single objective l=v along a path from I to a primary input I, where all the lines along the path have value x, and determines a primary input assignment i=$v_i$ that is likely to contribute to achieving l=v. Note that all values are obtained only by simulating primary input assignments, hence there are no unjustified values. Whenever there are several choices, both the selection of an objective and the selection of the backtraced path can be helped by controllability and observability cost functions.

In the FAN algorithm, several objectives may be jointly backtraced, however, due to the software implementation, objectives are only followed one at a time.

Figure 3:
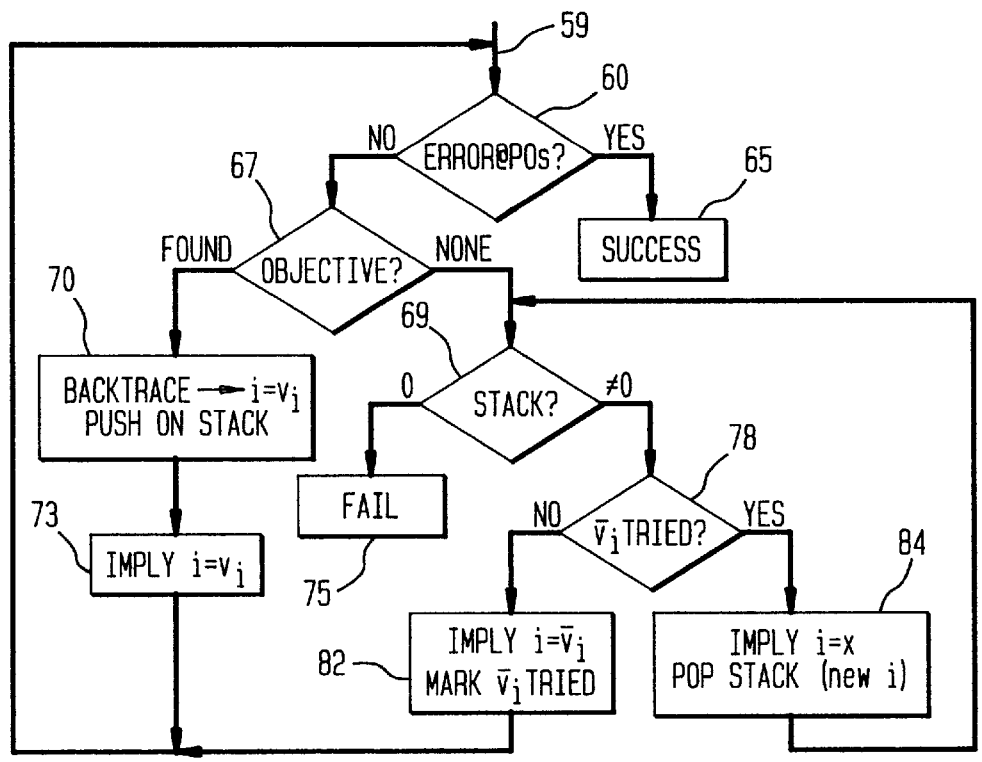
FIG. 3. illustrates a flowchart of a backtracing-type algorithm implemented by ATPG circuit of the invention.

FIG. 3 is a flow-diagram illustrating the backtracing-type algorithm that operates in accordance with the above-described PODEM and FAN algorithms. Initially, for a target fault, if an error (binary difference) is detected between primary output signals from the fault-free circuit and the corresponding primary output signals from the faulty circuit, as indicated at step 60, the algorithm terminates successfully, as indicated at step 65. Otherwise, the algorithm determines objectives at step 67, where the objectives try to activate the target fault, and to propagate its fault effects to primary outputs. The objectives are mapped by backtracing into a primary input assignment i=$v_i$, which is pushed on the decision stack as indicated at step 70. Then, the assignment i=$v_i$, is simulated at step 73 and the next determination is made as to whether the target fault will be detected at the primary outputs (step 60). Note that this is a continuous process with the goal of assigning primary input values that will result in the propagation of the error for detection at the primary outputs. If it is determined at step 67 that there are no more objectives, then this indicates that either the target fault could not be activated, or that no error could be propagated to a primary output; in either case a dead-end has been reached which requires backtracking. Thus, at step 69, a determination is made as to whether the stack is empty which would indicate that no untried alternative decision still exists. If the stack is empty, then the algorithm has failed because the target fault is undetectable as shown at step 75. If the stack is not empty, the last primary input assignment i=$v_i$ is at the top of the stack. If the complementary value $\overline{v}_i$ has not yet been tried, as checked at step 78, the algorithm will imply the complementary assignment i=$\overline{v}_i$ at step 82, and determine if the fault is detected (step 60). If both $v_i$ and $\overline{v}_i$ have been unsuccessfully tried, the algorithm implies i=x and pops the stack at step 84 to look for a previous assignment whose complement has not yet been tried (step 69).

Figure 4A:
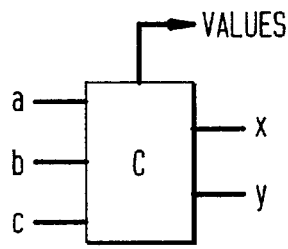
FIG. 4($a$) conceptually illustrates propagation of values in a forward network model of a circuit C.
Figure 4B:
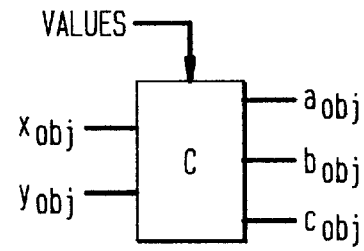
Figure 5A:
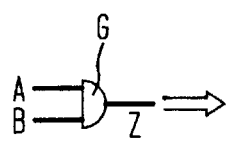
FIGS. 5($a$) and 5($b$), illustrate a mapping function for mapping of a gate G (FIG. 5($a$)) in the original circuit into an element G←in the forward network and an element G←in the backward network model (FIG. 5($b$)).
Figure 5B:
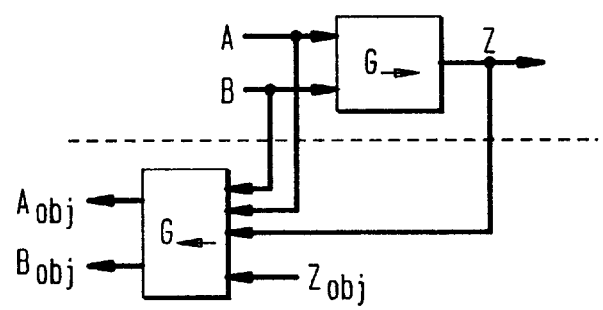

The main problem in implementing a backtracing-type algorithm in hardware is processing of objectives, which propagate only backward through the circuit, while a hardware model (of the type used in emulation) can only propagate values forward. In the hardware-implemented ATPG of the invention, the key idea for solving this dichotomy is to have two distinct models of the combinational digital circuit "C"—a forward model for propagating values such as shown in FIG. 4(a) having primary inputs a, b, and c and primary outputs x and y, and, a "backwards" model for propagating objectives such as shown in FIG. 4(b) having input objectives $x_{obj}$ and $y_{obj}$ (corresponding to the primary outputs of the forward model) and output objectives $a_{obj}$, $b_{obj}$ and $c_{obj}$ (corresponding to primary inputs of the forward model). It should be understood that to be able to forwardly propagate objectives in the "backward" network, the propagating values from the forward network model must be made available to the backward network model such as shown in FIGS. 4(a) and 4(b). To implement this, every gate G in the original digital combinational circuit, as shown in FIG. 5(a), must be mapped into an element G→in the forward network model and an element G←in the backward network model as shown in FIG. 5(b). Thus, in FIG. 5(b), current inputs A, B, and current output Z propagate the values (0, 1, or x) of their corresponding signals, while $A_{obj}$, $B_{obj}$, and $Z_{obj}$ represent objectives in the good circuit. The propagation of objectives in the backward network model requires the knowledge of values in the forward network; for example, an objective may propagate only on a line with value x, that is, not with binary values already present. It should be understood that a line such as A or $A_{obj}$ in FIG. 5(a) or 5(b) may be implemented by a group of signals to carry the codes needed to represent values or objectives.

Figure 6:
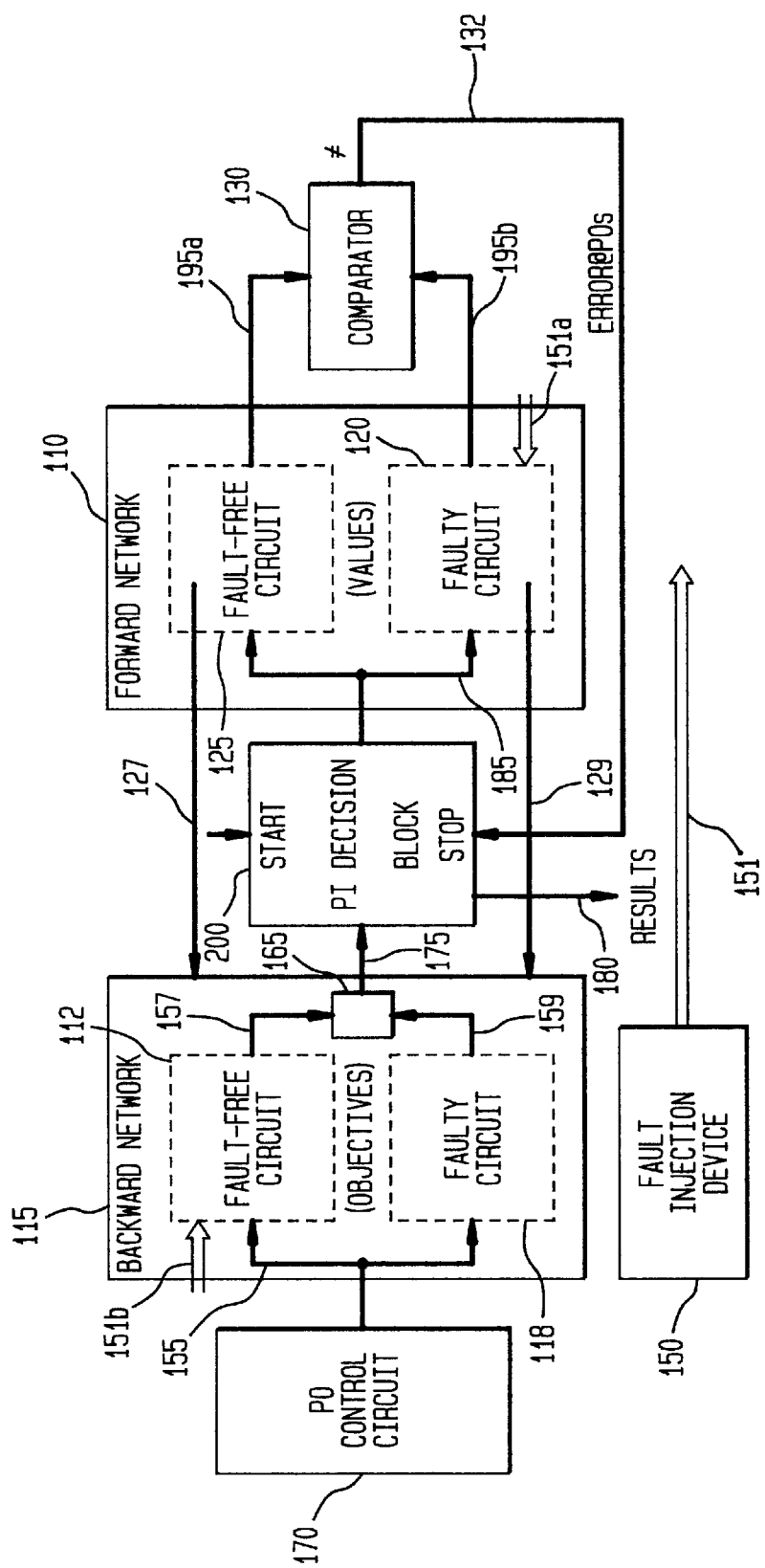
FIG. 6 illustrates a block diagram of the ATPG circuit 100 of the invention.

FIG. 6 shows the general block diagram of the ATPG circuit 100. As shown in FIG. 6, ATPG circuit 100 includes a forward network model 110 having emulated fault-free circuit 125 and emulated faulty circuit 120 with target fault values 151a to be injected into the faulty circuit 120 of the forward network 110 by fault injection mechanism 150 via fault injection signal lines 151. The forward network model processes primary input signals 185 received at each fault-free circuit 125 and faulty circuit 120 and propagates logic values in a forward direction to generate primary output signals 195a output from the fault-free circuit 125, and primary output signals 195b output from the faulty circuit 120.

The ATPG circuit 100 also includes a backward network model 115 of the circuit under test which likewise includes an emulated fault-free circuit 112 and emulated faulty circuit 118. Unlike the forward network model, however, a fault activation objective 151b corresponding to the target fault inserted into the faulty circuit 120 in the forward network model, is injected into the good circuit 112 of the backward network by fault injection mechanism 150 via fault injection signal lines 151. The objectives generated in the backward network model propagate in a backward direction relative to the propagation direction of values in the forward network model of the circuit as will be explained, i.e., "backward" is with respect to the original digital circuit. Specifically, for a given target fault, the emulated fault-free circuit 112 and emulated faulty circuit 118 generate respective fault effect propagation objectives and transmit them over lines 157, 159, respectively, to merging mechanism 165, where, as will be described, primary input objectives 175 are generated. Every primary input objective 175 is input to the PI Decision Block 200 which changes the values of one primary input 185 for further computation by the forward network. As will be explained, the PI Decision Block performs the decision process of the algorithm and eventually determines whether the search for a test vector for the current target fault indicated by the lines 151 has been successful. The result of the search is indicated by the Results lines 180. Failure to generate a test implies that the target fault is untestable.

In the block diagram of FIG. 6, the primary output objective control circuit 170 feeds the primary inputs of both the good backward 112 and the faulty backward 118 networks (it is called "PO" with reference to the primary outputs of the original combinational circuit ). Specifically, lines 155 supply respective good backward 112 and the faulty backward 118 networks with the initial primary objectives of the good forward 125 and faulty forward 120 circuits.

Lines 127 and 129 in FIG. 6 carry the logic values in the good and in the faulty forward networks, respectively, based on which the objectives are computed in the backward network, as explained above with respect to FIG. 4(b). As will be explained, these values will be used to determine fault-effect propagation objectives in the backward network model circuits 112 and 118.

Figure 1:
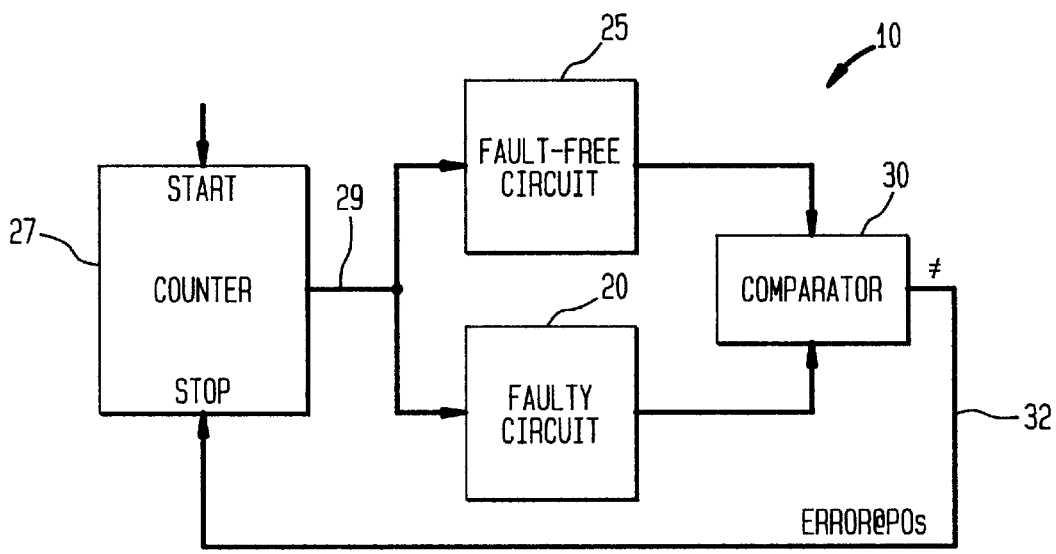
FIG. 1. is a general block diagram of an ATPG circuit implementation based on explicit enumeration.

The forward network good circuit 125, the forward faulty circuit 120, and the comparator device 130 work in the same way as their corresponding blocks described above with respect to FIG. 1, except in the ATPG circuit 100 of the invention, all circuits process 3-valued logic (0, 1 and x), as will be explained. The Error@POs output 132 detects only binary differences between the primary output values of the two circuits in the forward network. After the PI Decision Block 200 determines either that a test for the current target fault has been generated (when the signal Error@POs is asserted), or that the current target fault is undetectable, the Fault Injection Device 150 provides the next target fault on the signals 151. All the activity in the ATPG circuit 100 stops after the last target fault has been processed.

FIG. 7(a) illustrates the coding used in the forward network for modeling digital logic gates in the 3-valued logic system. To represent the value of a signal A, two bits, $A_0$ and $A_1$, are used, with $A_0$ meaning A has the value of either 0 or x; $A_1$ meaning that A has the value of either 1 or x; and $A_0=A_1=1$ meaning that A has unknown value "x". FIG. 7(b) and FIG. 7(c) respectively illustrate the mapping process 46 used to implement the forward network model of an OR gate (shown as the gate at the top of FIG. 7(b)) and the mapping process 47 used to implement the forward network model of an AND gate (shown at the top of FIG. 7(c)) in the 3-value logic system. In the forward network model gate implementations shown in FIGS. 7(b) and 7(c), the equations for $Z_0$ and $Z_1$, are easy to derive: for example, in FIG. 7(c), Z has the value of 0 or x when A is 0 or x, OR when B is 0 or x ($Z_0=A_0+B_0$). Z has the value of 1 or x when both A AND B are 1 or x ($Z_1=A_1 \cdot B_1$). The mapping for an inverter (not shown) with input A and output Z is given by $Z_0=A_1$ and $Z_1=A_0$, with the negation being realized without logic and implemented just by swapping $A_0$ and $A_1$. A NAND gate can be modeled by an AND gate followed by an inverter, and a NOR gate can be similarly modeled by an OR gate followed by an inverter. The faulty forward network 120 is identical to the good one 125, except for the fault effect being always inserted at the target fault site.

In the Backward Network model of FIG. 6, objectives 175 are separately generated for the good circuit 157 and for the faulty circuit 159. For a "stuck-at-v" fault on line l, where v is 0 or 1 (hereinafter l "stuck at v") the fault activation objective l=$\overline{V}$ is generated only in the good circuit (l already has a binary value in the faulty circuit). FIGS. 8(a) and 8(b) illustrate the generation of fault-effect propagation objectives for an AND gate "G" in the good circuit. F denotes its corresponding gate in the faulty circuit. The notation v/v$_f$ represents composite logic values of the form good_value/faulty_value, i.e., G has a value 0 at an input and F has value 1 at the same input. FIG. 8(a) shows a 0/1 fault-effect that has reached an input of the AND gate, but not its output. (Such a gate is said to belong to the error-progagation frontier). To enable the propagation of the fault effect through the gate, a 1-objective (indicated as←1) is generated only in the faulty circuit for the gate input with value x. FIG. 8(b) shows that a 1/0 fault-effect has reached an input of the AND gate, but not its output. To enable the propagation of the fault effect through the gate, 1-objectives (indicated as←1) are generated only in the good circuit for the gate inputs with value x. It should be understood that skilled artisans may readily determine fault effect propagation rules in OR, NOR, NAND and other logic gates in accordance with a similar analysis as explained herein with reference to FIGS. 8(a) and 8(b).

To propagate objectives in the backward network, three situations are distinguished: a line with a 0-objective, or with a 1-objective, or without any objective. Thus, two bits are used to code these three "values", as shown in the dual-rail coding table of FIG. 9(a). As shown in FIG. 9(a), one of the bits is the objective flag, which denotes whether there is an objective for a line, and the other bit gives the objective value (0 or 1) when the objective flag is 1.

Objectives are independently generated and propagate separately and independently in the good circuit and the faulty circuits in the backward network, and merge at primary inputs 175 before being processed by the PI Decision Block 200, as shown in FIG. 6. The merging circuit 165 (of FIG. 6) for a single primary input is shown in FIGS. 10(a) and 10(b). FIG. 10(a) comprises an OR gate 91 where the primary input objective flag corresponding to the good circuit and the primary input objective flag corresponding to the faulty circuit (denoted by GoodPI_F and FaultyPI_F, respectively) are OR'ed in to obtain the final primary input flag PI_F and FIG. 10(b) comprises logic circuit 93 where the primary input objective value PI_V is determined from primary input objective values from respective good and faulty circuits (indicated as GoodPI_V and FaultyPI_V, respectively) and the corresponding flags.

If a single branch B1 or B2 of a stem S, illustrated in FIG. 11(a), has an objective, i.e., B1$_{obj}$ and B2$_{obj}$, respectively, it should propagate on the stem S. The circuits shown in FIGS. 11(b) and 11(c) are used to compute the objective for a stem S given the objectives of its fanout branches, B1 and B2. Thus, as illustrated in FIG. 11(b), the two flags (denoted by B1_F and B2_F) are OR'ed in OR logic gate 94 to obtain the input objective flag for the stem, S_F, and, as illustrated in FIG. 11(c), the value (B1_V or B2_V) corresponding to the active flag values is selected by the logic circuit 95 to obtain the value S_V for the stem objective. The circuits illustrated in FIGS. 11(b) and 11(c) are encapsulated by the truth table shown in FIG. 14(a), where the stem objective is represented by S$_{obj}$. As can be seen in view of FIGS. 10(a), 10(b), 11(b) and 11(c), in a first embodiment, the mechanism for merging corresponding output objective flags and objective values from the good and faulty circuits in the merge block 165 of backward network model 115 is the same as the mechanism for computing the objective for a stem S given the objectives of its fanout branches, B1 and B2.

FIG. 13(a) illustrates the objective computation rules for a 2-input AND gate in the good circuit of the backward network (such as the 2-input AND gate G shown in FIG. 12(a)). As shown in FIG. 12(a), Z$_G$ represents the good output value, Z$_F$ represents the faulty output value, and as shown in FIG. 12(b), Z$_{obj}$ is the objective for Z$_G$, A$_G$ and B$_G$ are the current input values in the good circuit, and A$_{obj}$ and B$_{obj}$ are the objectives computed for the AND gate inputs. The first row 96 of the table shown in FIG. 13(a) indicates that no input objectives exist when Z$_G$ has a binary value. The following three rows 97 deal with the propagation of the output objective Z$_{obj}$ to a gate input having an x (unknown) value. For an inverting gate, the value for the input objective would be the complement of the output objective. The following row 98 deals with the situation when there is no output objective and both Z$_G$ and Z$_F$ have unknown value x; in this case, no input objectives are created. The last two rows 99 of the table illustrate the conditions for generating a fault propagation objective. It should be understood that similar tables are devised for objective computation rules for other logic gates (e.g., OR, NOR, NAND gates).

An important speed-up technique called the x-path check used in software ATPG algorithms allows a gate G to be considered for error propagation only if there exists at least one path from G to a primary output, such that every line on the path has value x. For example, as illustrated in FIG. 15, gate A (in the good circuit) fails the x-path check, as potential propagation paths from A are blocked at gates C and D, while from gate B there is such a path for propagating an error through gate E. In this case, without the look-ahead provided by the x-path check, the algorithm may spend a lot of computational effort in trying to propagate the fault effect along a path through A, without realizing that all this search is being wasted. In a preferred embodiment of the ATPG circuit 100, the same result is achieved as the x-path check by implementing a more general technique as follows:

Given the primary input assignments already made, a line is alive if a change in its value, caused by assignments to primary inputs currently with value x, may influence the value of at least one primary output. Any line not alive will be referred to as dead. Note that any line with binary value is dead, and any line that feeds (directly or indirectly) only dead lines is dead as well. Since the good and the faulty circuits have different values, their dead and alive lines will also be different. The broken line triangular regions 105a,b,c shown in FIG. 15 indicate dead areas (containing only dead lines) of the good circuit. Note that the dead areas always contain all the paths that will fail the x-path check. One of the tasks of the ATPG circuit 100 is to continuously identify the dead areas of the good and the faulty circuits. Since the identification of a dead area should proceed backward through the circuit, it is combined with the propagation of objectives.

Thus, as shown in the table for objectives coding illustrated in the preferred embodiment of FIG. 9(b), to propagate objectives in the backward network, four situations are distinguished: a line with a 0-objective, a line with a 1-objective, a line without any objective and, in this category, a further distinction is made between a dead line, which should never be assigned an objective (since any objective would be useless), and an alive line, which may be assigned an objective later. A useless objective will identify a dead line. Again, two bits are used to code these four "values", as shown in FIG. 9(b). One of the bits is the objective flag, which denotes whether there is an objective for a line; when the flag is 1, the other bit gives the objective value (0 or 1); when the flag is 0, the other bit distinguishes between a dead and an alive line.

Figure 16A:
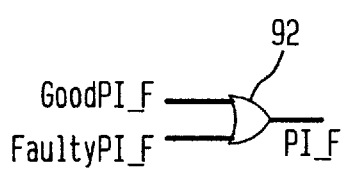
FIGS. 16(a) and 16(b) illustrate the mechanism for merging good and faulty objectives corresponding to objective coding used in the second embodiment according to the table of FIG. 9(b).
Figure 16B:
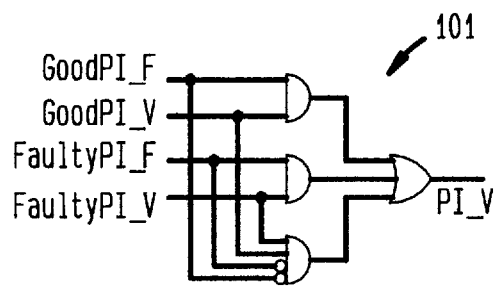

As described above with respect to the first embodiment, objectives are generated and propagate independently in the good and the faulty circuits of the backward network with objectives 157 and 159 being merged by the block 165 before being processed by the PI Decision Block 200. Thus, in the second embodiment, the merging circuit 165 (of FIG. 6) for a single primary input, is shown in FIGS. 16(*a*) and 16(*b*). FIG. 16(*a*) illustrates an OR gate 92 where the primary input objective flag corresponding to the good circuit and the primary input objective flag corresponding to the faulty circuit (denoted by GoodPI_F and FaultyPI_F, respectively) for the second embodiment, are OR'ed in to obtain the final primary input flag PI_F. FIG. 16(*b*) comprises logic circuit 101 where the primary active objective value PI_V is determined from the above flags and the primary input objective values from respective good and faulty circuits (indicated as GoodPI_V and FaultyPI_V, respectively), so that when both good and faulty abjectives are dead, the resulting objective is also dead.

Figure 17A:
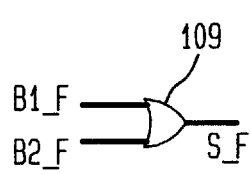
FIGS. 17(a) and 17(b) illustrate the mechanism for computing a stem objective given the objectives of its fanout branches B1 and B2 in the second embodiment of the invention.
Figure 17B:
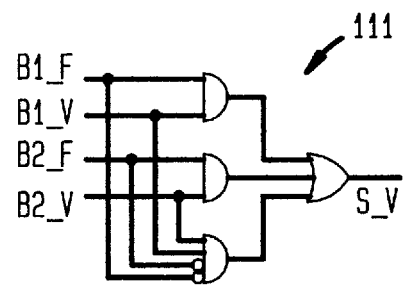

Similarly, FIGS. 17(*a*) and 17(*b*) illustrate respective circuits used to compute the objective for a stem S given the objectives of its fanout branches, B1 and B2, as illustrated generally in FIG. 11(*a*). As illustrated in FIG. 17(*a*), the two flags (denoted by B1_F and B2_F) are OR'ed in OR logic gate 109, and the value (B1_V or B2_V) corresponding to the active flag is selected by the logic circuit 111; when no flag is active in either of the fanout branches, the two values are ANDed in logic circuit 111 as shown in FIG. 17(*b*), so that the resulting value will indicate a dead stem only when all its branches are dead. When the two branches have different binary objectives, as a tie-breaking rule, the 1-objective is given priority over the 0-objective in the logic circuit 111. For a stem with more than two branches, a majority voter circuit, such as may be devised by skilled artisans, may be used to give priority to the most requested objective. The circuits illustrated in FIGS. 17(*a*) and 17(*b*) are encapsulated by the truth table shown in FIG. 14(*b*), with flag and value inputs B1_F and B1_V representing the objective B1$_{obj}$ for one branch B1, and flag and value inputs B2_F and B2_V representing the objective, B2$_{obj}$, for branch B2, and, S_V and S_F representing flag and value inputs for the stem objective, S$_{obj}$. As can be seen in view of FIGS. 16(*a*), 16(*b*), 17(*a*) and 17(*b*), in the second embodiment, the mechanism for merging corresponding output objective flags and objective values from the good and faulty circuits in the merge block 165 of backward network model 115 is the same as the mechanism for computing the objective for a stem S given the objectives of its fanout branches, B1 and B2.

The table illustrated in FIG. 13(*b*) summarizes the objective computation rules for a 2-input AND gate in the good circuit (shown in FIG. 12(*a*)), where Z$_G$ represents the output value in the good circuit, Z$_F$ represents the output value in the faulty circuit, Z$_{obj}$ is the objective for Z$_G$, A$_G$ and B$_G$ are the current input values in the good circuit, and A$_{obj}$ and B$_{obj}$ are the objectives computed for the AND gate inputs (FIG. 12(*b*)). The first two rows 102 of the table in FIG. 13(*b*) state that all inputs are marked as dead when the output is dead or has a binary value. The following two rows 104 show that current inputs with binary values are always marked dead. The next four rows 106 correspond to the instance of propagating an output objective to the AND gate input having an x value input. For an inverting gate, the value for the input objective would have been the complement of the output objective. The following row 107 shows that a gate whose both inputs have unknown values and whose output has no objective, does not generate any input objectives. The last two rows 108 show the generation of a fault propagation objective (refer to FIG. 8(*b*).) It is understood that the truth table illustrated for a two-input AND gate as illustrated in FIG. 13(*b*) is provided for descriptive purposes and that truth tables are implemented for calculating objectives in other digital logic gates, e.g., OR, NAND, and NOR gates, existing in the original digital circuit.

Figure 18:
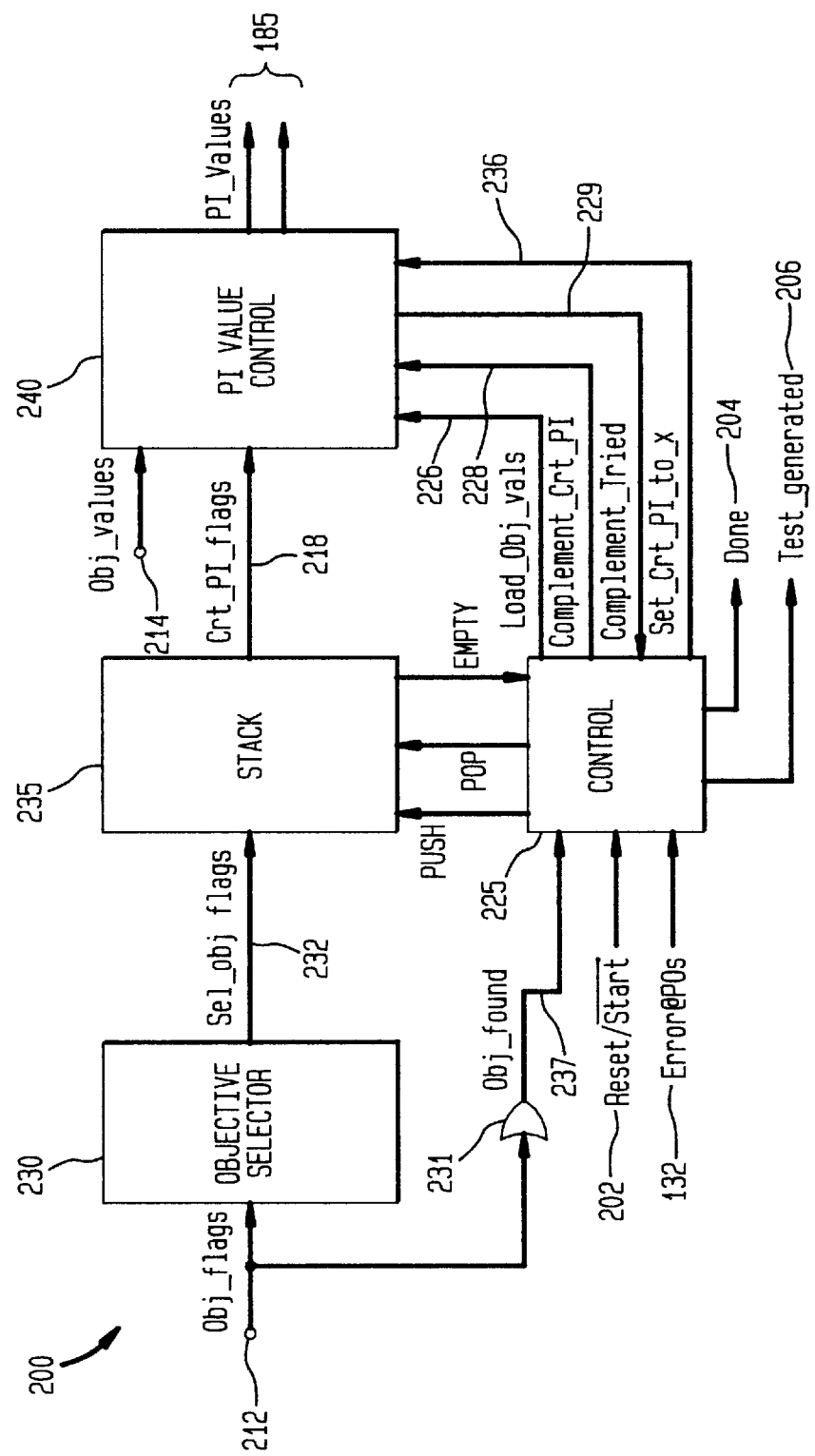
FIG. 18 is a block diagram representation of the Primary input ("PI") Decision Block 200 of FIG. 6.

FIG. 18 is a block diagram representation of the PI Decision Block 200. Every heavy line represents a group of n signals, where "n" is the number of primary inputs. After merging in the backward network, the primary input objectives 175 arrive from the backward network as two separate groups, Obj_flags signals 212 and Obj_values signals 214. The Control block 225, whose activity is initiated by Reset/Start signal 202 receives Error@POs signal 132 from the output value comparator 130, and generates Done signal 204 when the test generation job is done; at that time, the signal Test_generated signal 206 indicates whether the target fault has been detected or has been proven undetectable. PI_Values, lines 185 produced by the PI Value Control block 240, are the 3-valued logic representation of the generated vector which feeds the forward network 110. The Control block 225 and the Stack 235 are implemented to perform the decision-making processes outlined in FIG. 3.

At the beginning of an ATPG operation, in the PI Decision Block 200, the PI_values 185 are first initialized as unknown "x" values, and the Fault Injection Device 150 inserts the first target fault. As will be explained, the fault effect is inserted in the forward faulty model, and a corresponding fault activation objective is set in the backward good network model. Unlike in any software implementation of PODEM or FAN, where only one objective at a time can be processed, several objectives may be propagating concurrently through the backward network in the ATPG circuit. Thus, several primary input objective flags may be on in accordance with the objective coding table of FIG. 8(*b*). The Objective Selector block 230 selects one of them, so that Sel_ob_flags group of signals 232 has, at most, one bit set. The OR gate 231 receives all of the Obj_flags signals 212 and generates the Obj_found signal 237 that informs the Control block 225 whether at least one objective has been found in accordance with the flowchart of FIG. 3.

When an error is detected at a primary output, the Control block 225 receives the Error@POs signal 132 and asserts both a Done signal 204 and Test_generated signal 206. Otherwise, if an objective has been found, Sel_Obj_flags signals 232 are pushed on the Stack 235 as directed by the Push signal from the control block 225. The top of the Stack 235 is always available as Crt_PI_flags signals 218 which are used to select the primary input whose value is to be changed. The value of the selected primary input is taken from Obj_values signals 214 under the control of Load_Obj_vals signal 226 generated by the control block 225. If no objectives are found, a check is made to determine the status of the Stack 235. If the Stack 235 is not empty, i.e., has not generated Empty signal, the value of the current primary input is either complemented in the PI Value Control block 240 upon receipt of the Complement_Crt_PI signal 228 generated by the control block 225, or, if the Complement_Tried signal 229 is asserted, the PI Value Control block 240 sets the value of the current primary input to x as commanded by the Set_Crt_PI_to_x signal 236. Thereafter, the control block initiates the Stack 235 to pop the next primary input value present on the stack by generating the Pop command signal. When the Stack is Empty, the Control block asserts Done and sets Test_generated to logic 0.

The approach to targeting a set of faults is conceptually similar to the dynamic fault injection method of Cheng et al.

as described in K.-T. Cheng, S.-Y. Huang, and W.-J. Dai, "Fault Emulation: A New Approach to Fault Grading," Proc. ICCAD, pp. 681–686, November 1995. The goal is to insert the target faults one-at-a-time without having to repeatedly reconfigure the circuit, which would represent a large overhead. In the inventive method, the fault injection gates in the ATPG circuit are introduced at the logic level, before the mapping into FPGAs takes place, while the fault injection in the prior art approach is done after mapping which makes it dependent of the particular FPGAs family used in the reconfigurable hardware. (The fault insertion mechanism used in the above-mentioned Hirose et al. reference is totally different, as it is geared for parallel fault simulation.)

Figure 19:
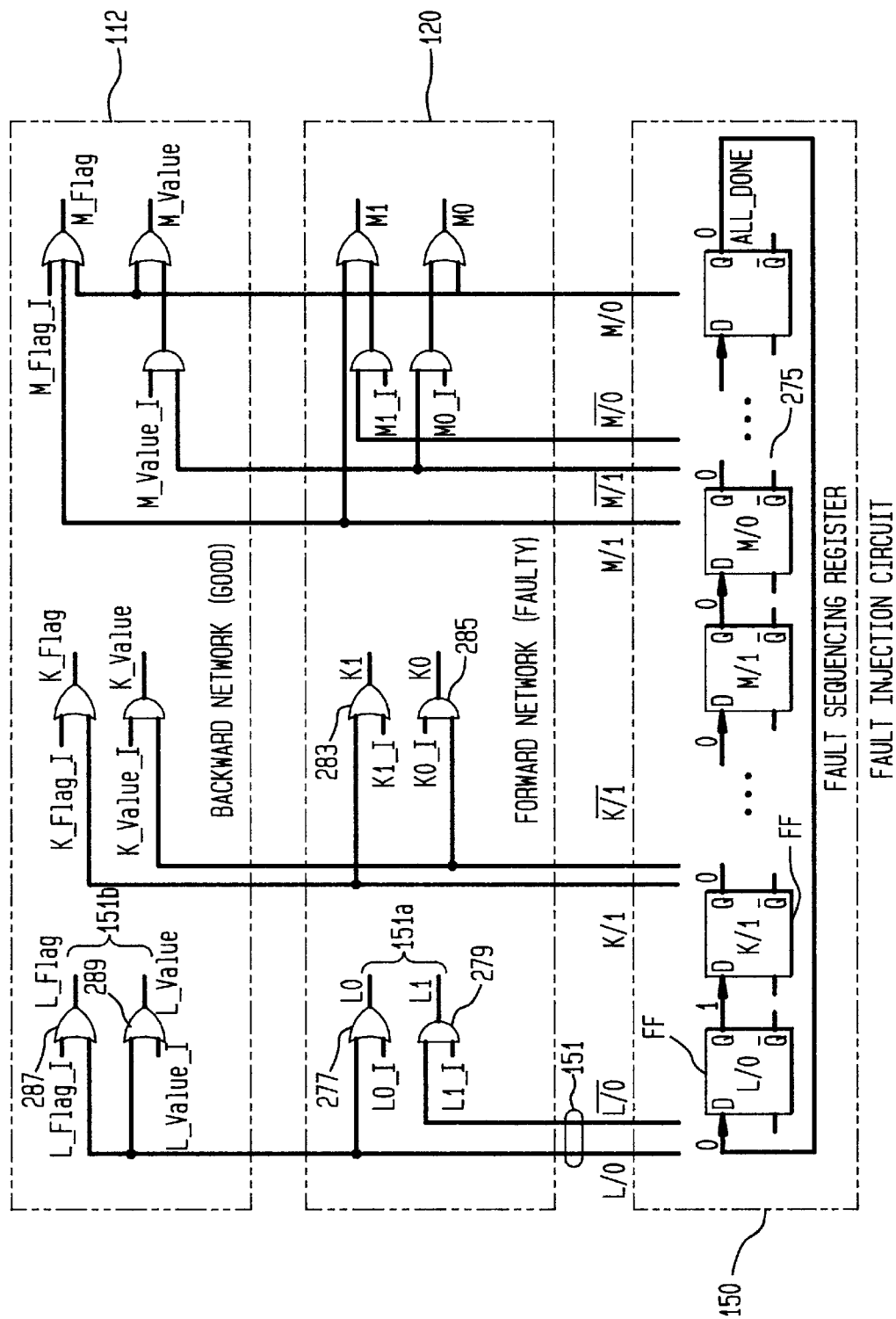
FIG. 19 illustrates the fault injection circuit for inserting various faults in the ATPG circuit 100.

As shown in FIG. 19, the fault injection device 150 consists of a Fault Sequencing Register for controlling the process of inserting the effect of the target fault in the faulty circuit 120 and setting a fault activation objective in the good circuit 112. Particularly, the Fault Sequencing Register is a circular shift-register 275 comprising serially connected flip-flops ("FF"), with one FF corresponding to every possible target fault in the digital circuit and one additional FF. Thus, if there are f (collapsed) target faults in the circuit under test, the Fault Sequencing Register has f+1 FFs. At any time, only the FF corresponding to the current target fault has value 1, while all other FFs have value 0. The Fault Sequencing Register is initialized to output logic values 1000 . . . 0, as shown in FIG. 19. Changing the target fault is done by shifting the register in the direction indicated by arrows, when the PI Decision Block 200 asserts the Done signal 204. The additional FF (ALL_DONE) is the last FF of the circular shift-register and after all f faults have been processed, the 1 value is shifted into ALL_DONE, which signals the end of the entire ATPG job.

For illustrative purposes, FIG. 19 illustrates the fault injection circuit for faults L s-a-0, K s-a-1, M s-a-0, and M s-a-1 (In the nomenclature defined herein S/v denotes S s-a-v) to be inserted, with the current target fault being L/0. It should be understood that by analyzing the faulty circuit in the forward network, it will be possible to configure the hardware beforehand so that the correct fault, e.g., L s-a-0, K s-a-1, will be inserted. For a L s-a-0 fault, signals L0 and L1 represent the doublerail coding for the value of line L (see the 3-value logic coding of FIG. 6(a)), and signals L0_I and L1_I represent the value of L before inserting the fault. When the fault is not present (the FF L/0=0), the values of L0_I and L1_I propagate through gates 277 and 279, respectively to L0 and L1 without change. On the other hand, when L/0 is the current target fault, then L/0=1, which results in L0=1 and L1=0; hence line L is "stuck-at" 0 in the faulty circuit. A similar technique inserts a fault K/1 by setting K0=0 and K1=1 in respective gates 285 and 283. The circuit for line M is a little different, because two faults have to be inserted on M, when both s-a-0 and s-a-1 faults must be inserted on lines such as fanout stems. Here the value M0_I propagates to M0 without change through the gates 293 and 295, and value M1_I propagates without change through the gates 297 and 299, only when neither fault is present (M/0=M/1=0).

In the backward network model 115, the effect of inserting a fault is to generate the fault activation objective in the good circuit 112. Thus, at every location in the good circuit 112 of the backward network model corresponding to a target fault location in the faulty circuit 120, the L_Flag and L-Value lines represent the objective flag and the objective value for line L (see the objectives coding table 3 of FIG. 8(b)), and L_Flag_I and L_Value_I represent the objective of L before inserting the fault. When the fault is not present (L/0=0), the values of L_Flag_I and L_Value_I propagate without change respectively through gates 287 and 289, respectively to L_flag and L_Value. On the other hand, when L/0 is the current target fault, then L/0=1, which results in L_flag=1 and L_Value=1, denoting a 1-objective for line L. Similarly, inserting K/1 results in a 0-objective for K.

The hardware-intensive approach for implementing the ATPG function results in a forward network almost four times larger than the original circuit, because every original gate is mapped into two gates (see FIGS. 6(a) and 6(b)) in both the good and the faulty circuits (except inverters, whose implementation is logic-free). The more complicated functions done by the backward network—generation and propagation of objectives, and identifying the dead areas—require more logic. For every stem with k fanout branches, a circuit having k+3 gates is needed (see FIGS. 12(a) and 12(b) for k=2), and for every primary input a similar circuit with 5 gates is needed. For every original gate, an 8-gate circuit is needed to implement the table illustrated in FIG. 14 in both the good and the faulty circuits. As shown in FIG. 16, every injected fault requires one FF and about 4 gates. For a circuit with n primary inputs, the Stack is implemented by a n-word RAM with n bits/word, and PI Value Control block 240 has three (3) n-bit registers (two for the primary input values and one for the Complement-tried flags—see FIG. 18). Overall, the ATPG circuit 100 is about 30 times larger than the original circuit.

Figure 20:
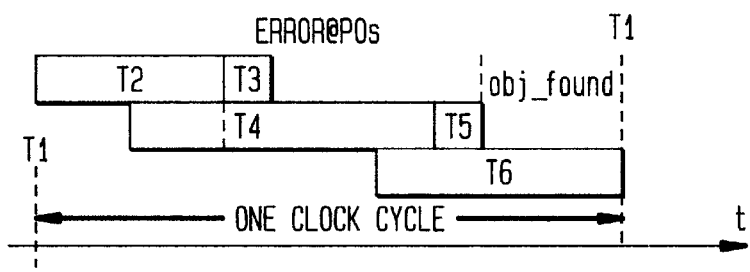
FIG. 20 outlines a timing diagram of the processing done in one clock cycle.

FIG. 20 outlines a timing diagram of the processing done in one clock cycle. After the primary input assignment indicated at time T1, the new primary input value propagates in the forward network, indicated by the interval T2). The primary output values of the good and faulty circuits are continuously being compared, and Error@POs becomes valid shortly after the forward propagation has stopped after the interval T3. As a result of values changing in the forward network, new objectives may be generated and old objectives may be canceled in the backward network; the propagation of objectives also establishes a new partition between dead and alive lines. After the propagation of objectives stops, (end of interval T4,) the Obj_found signal becomes valid at the end of interval T5. The last interval, indicated at time T6 represents the activity in the PI Decision Block—objective selection, the decision logic, and stack manipulation—which prepares the next primary input assignment, and the process repeats at time T1.

Since the ATPG circuit is implemented on reconfigurable logic, its size is not important, unless it does not fit in the emulator. The largest capacity available today for emulation is about 6 million gates. However, a simple partitioning technique can help a processor with a limited capacity M handle circuits of much larger size. A cone is the logic feeding one primary output. The ATPG circuit may be partitioned into several regions by grouping together highly overlapping cones, so that the resulting subcircuits are as disjoint as possible, and the size of each region is below M. (Overlap between cones can be analyzed in terms of common primary inputs.) If the regions are totally disjoint, they may be processed one at a time, but, in general, there will be some partial overlap among regions, which results in some faults residing in more than one region. If such a fault is detected in one subcircuit, it should not be targeted any more. But such a fault may be declared undetectable only after it has been found undetectable in every region containing it. So the main cost of this partitioning technique is the repeated targeting of some faults in the overlapping regions.

A better solution makes use of the virtual logic capability offered by recent FPGAs. For example, in a large combinational circuit as shown conceptually in FIG. 21, only a relatively small subcircuit is involved in the detection of a target fault, e.g., the cones 305 and 307 of all the primary outputs 310 where a fault effect from the fault site may propagate to. Then only the regions 305 and 307 need to be present in the reconfigurable logic until faults in a different region are targeted. Incremental dynamic reconfiguration can be used so that the region for the next target fault will be loaded when that fault becomes the current target.

Figure 21:
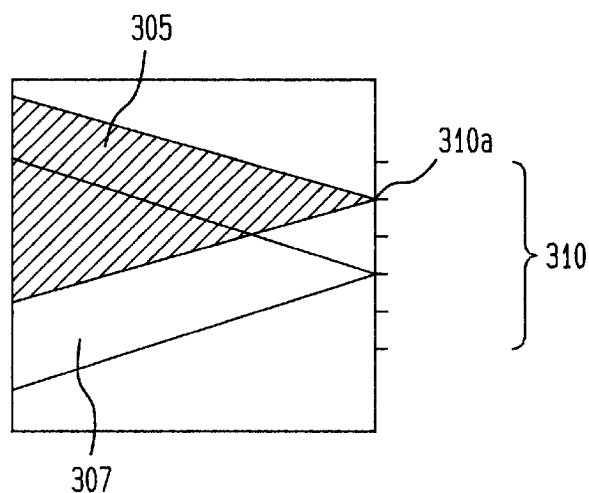
FIG. 21 conceptually illustrates a large combinational circuit and a relatively smaller primary output cone containing the circuitry feeding that primary output.

In the ATPG circuit 100 of the invention, all gates from the fault propagation frontier are processed concurrently, and each such gate generates an objective that starts propagating through the backward network. Propagating objectives indiscriminately, however, may cause more work than is really necessary. For example, the fault-effect propagation effort may alternate among several propagation paths leading to different primary outputs 310, when only one such path would have been sufficient. To avoid this problem the working area of the ATPG algorithm is restricted to one sub-circuit feeding one primary output, i.e., a primary output cone, at a time as illustrated in FIG. 21. For example, the primary output 310a whose cone 305 the algorithm is currently using is referred to as the active primary output, and the other primary outputs are referred to as inactive primary outputs. In the ATPG circuit 100, the cones of the inactive primary outputs are temporarily treated as dead areas of the circuit. To effect a "dead" area, the primary output objective control block 170 (shown in FIG. 6) which provides the initial objectives for the primary inputs of both the good backward 112 and the faulty backward 118 networks, will provide dead objectives for all of the primary inputs corresponding to inactive primary outputs whose further propagation will mark an entire primary output cone as dead. The active primary output, e.g., primary output 310a, in FIG. 21, receives a "none now" objective (see FIG. 9(b)) from the primary output control block, which allows objectives to propagate in cone 305. If the target fault resides in the active primary output cone, objectives will be generated inside the backward network. The primary output objective control block 170, which may be implemented using a shift register, activates one primary output at time, by setting all others primary outputs (i.e., primary inputs in the backwark network) to "dead" objectives.

Another common speed-up technique used in ATPG programs is to fault-simulate every generated test vector to determine the faults "accidentally" detected in addition to the target fault. All the detected faults are then discarded from the set of possible target faults, so that they are detected without being explicit targets. This represents an important saving of computational effort. The same fault injection mechanism shown in FIG. 19 can be used to implement a simple serial fault simulation, where, after a test has been generated for the current target fault (indicated by the signal Test_generated 206 (FIG. 18), the remaining target faults are injected in turn (by shifting the Circular Shift Register 275) without changing any primary input assigned to binary values in the current vector. Checking the Error@POs signal 132 (FIG. 6) is sufficient to determine whether the current vector (primary input values) detects the newly inserted fault. Hence, every fault can be simulated in one clock cycle.

A Status Register (not shown) having one FF for every target fault must be added to allow already detected faults to be skipped. Every FF in the Status Register is initialized to 0 and it should be set to 1 when its corresponding fault is detected. Implementing the skipping mechanism should be simple for persons skillful in the field.

Figure 22:
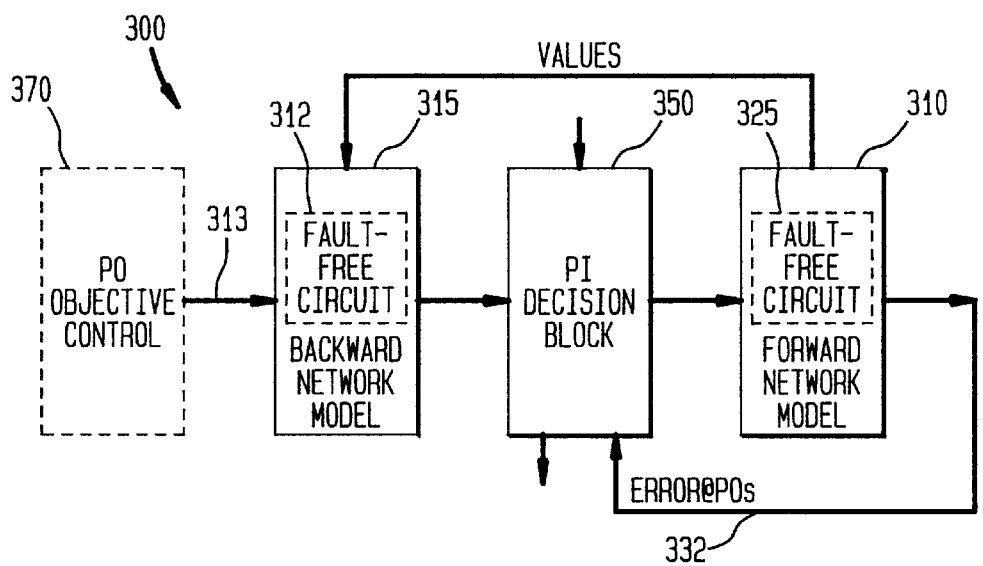
FIG. 22 is a block diagram of the satisfiability circuit 300 of the invention.

FIG. 22 shows a block diagram of a satisfiability circuit 300 that is similar to the automatic test pattern generator circuit of the invention. In this embodiment, the satisfiability circuit 300 performs a simpler task, namely, detecting only a stuck-at-0 fault at a single primary output Z of a digital combinational circuit. In other words, the satisfiability circuit for a given combinational circuit with a single primary output Z, operates to determine a vector of primary inputs that will drive Z to a logic 1.

The satisfiability circuit 300 is much simpler than the ATPG circuit shown in FIG. 5. First, the forward and backward models of the faulty circuit are no longer needed, since the only objective here is to drive Z (in the good circuit) to 1. Hence the primary output objective control block is also no longer useful, since the backward network has only one input objective corresponding to Z=1. Furthermore, there is no longer need for the output value comparator, since the result is given by the value of Z. Also, the fault insertion block is no longer required, as all the work is done within the good circuit. The backward good circuit model is a simplified circuit, because there is no need for objectives for generating and propagating fault effects. Furthermore, there is no need for a merging block for merging objectives from the good and the faulty circuits. Consequently, the contents of the table for computing objectives, as described above with reference to an AND gate as shown in FIG. 13(b), for example, does no longer have the column for $Z_f$, and does no longer need the last two rows (for generating fault-effect propagation objectives).

As illustrated in FIG. 22, the satisfiability circuit 300 contains a fault-free emulation 325 of the combinational digital circuit in forward network model 310 and a fault-free emulation 312 of the combinational digital circuit in a backward network model 315 with the functioning of these blocks as described herein. The function of the primary input decision block 350 is the same as in FIG. 5.

In the block diagram of FIG. 22, the satisfiability circuit 300 is employed for solving satisfiability problems, such that, given a combinational digital circuit with output Z and inputs $x_1, x_2, \ldots, x_n$, determine an input vector that sets Z=1. In other words, if $f(x_1, x_2, \ldots, x_n)$ is the function of Z, the satisfiability circuit is implemented to either find a solution to the equation $f(x_1, x_2, \ldots, x_n)=1$, or to determine that no such solution exists. (In terms of automatic test pattern generation, the equivalent problem is to find a vector that detects Z stuck-at-0, or prove that Z stuck-at-0 is undetectable.) Thus, in the satisfiability circuit 300, the forward network model has only two (2) outputs, Z0 and Z1 that carry the 3-valued code for Z, which is the only primary output of the original circuit. Correspondingly, the backward network has only 2 primary inputs corresponding to the flag and the value for the objective for Z, which is always 1. A vector that solves the satisfiability problem is obtained when the primary output value is 1 in the forward network. It should be understood that the output may still be called Error@POs signal 332 to keep it consistent with the block diagram of FIG. 6, but rather the output indicates when a solution has been obtained.

Figure 23A:
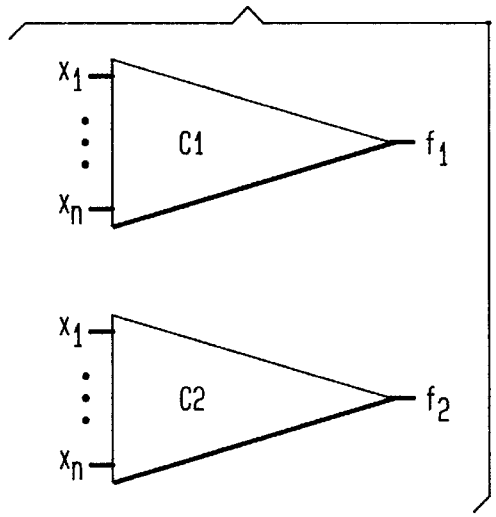
FIG. 23(a) conceptually illustrates two circuits C1 and C2 that are to be compared by the satisfiability circuit 300 of the invention.
Figure 23B:
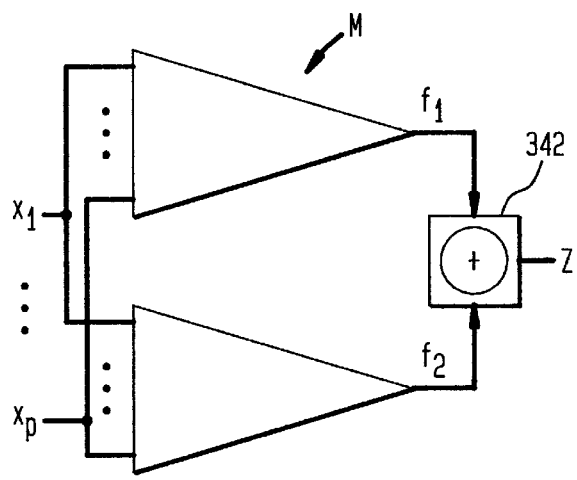
FIG. 23(b) conceptually illustrates a composite circuit M of the two circuits C1 and C2 that are to be compared in FIG. 23(a).

The satisfiability circuit 300 of the invention may be used in circuit verification, where two circuits may be automatically compared to prove that they implement the same function, or to generate a vector that causes different responses. For example, as shown in FIG. 23(a), combinational circuit C1 having primary inputs $x_1, x_2, \ldots, x_n$ and output $f_1$, and circuit C2 having primary inputs $x_1, x_2, \ldots, x_n$ and output $f_2$, are to be compared. As shown in FIG. 23(b), these circuits are used to create a composite circuit M, where every primary input of M feeds corresponding primary inputs of C1 and C2, and $f_1$ and $f_2$ feed an exclusive-OR gate 342 that produces the primary output Z. Then, the satisfiability circuit 300 (FIG. 22) is used for M to generate a vector that sets Z=1. If such a vector is found, this shows that $f_1$ and $f_2$ are set by this vector to different values, and hence it shows that C1 and C2 implement different functions; otherwise, no such vector exists and the two primary outputs have the same function. The generalization for the case where C1 and C2 have several primary outputs should be obvious to persons skilled in the art.

Figure 24A:
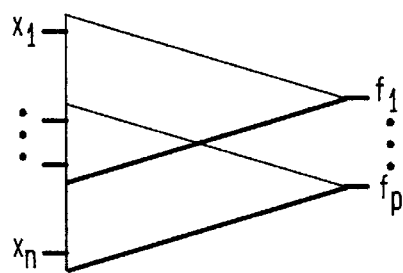
FIGS. 24(a) and 24(b) conceptually illustrate a circuit to model a system of Boolean equations that are to be solved by the satisfiability circuit 300 of the invention.
Figure 24B:
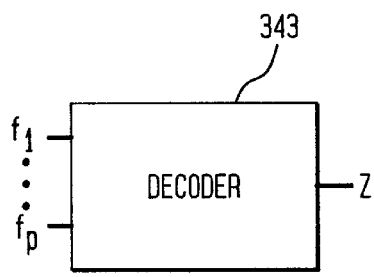

In another application illustrated in FIG. 24(a), the satisfiability circuit 300 of the invention may also be used in solving systems of boolean equations of the form:

$$f_1(x_1, x_2, \ldots, x_n) = v_1$$

$$f_2(x_1, x_2, \ldots, x_n) = v_2$$

$$f_p(x_1, x_2, \ldots, x_n) = v_p$$

where $f_i(x_1, x_2, \ldots, x_n)$ is a boolean function, and $v_i$ is a 0 or 1 constant. The application involves the steps of building the logic circuit to model every $f_i(x_1, x_2, \ldots, x_n)$; and, building the model of the satisfiability circuit 300. However, as shown in FIG. 24(b), this step includes the step of adding a decoder circuit 343 whose output is 1 if and only if every $f_i$ output has value $v_i$. For example, if a system of equations have three (3) outputs P, Q, and R and it is desired to have their values as P=1, Q=0, and R=1, then the decoder circuit 343 will implement Z=AND(P, $\overline{Q}$, R).

If the satisfiability circuit finds a vector that sets Z=1, the obtained values for $x_1, x_2, \ldots, x_n$ are a solution to the system of equations; if no vector is generated, the system does not have any solution.

The foregoing merely illustrates the principles of the present invention. Those skilled in the art will be able to devise various modifications, which although not explicitly described or shown herein, embody the principles of the invention and are thus within its spirit and scope.

What is claimed is:

1. Automatic test pattern generator for generating test patterns that are capable of detecting faults in a digital combinational circuit, said test pattern generator comprising:
   a) a first forward network capable of emulating said digital combinational circuit;
   b) a second forward network capable of emulating said digital combinational circuit in the presence of any one target fault from a specified set of faults, and receiving a set of control signals for selecting the target fault;
   c) a first backward network having one primary input for every primary output of said digital combinational circuit and one primary output for every primary input of said digital combinational circuit, said first backward network generating one fault activation objective corresponding to said selected target fault, and receiving first signal values computed in said first forward network for propagating the fault activation objective towards a primary output;
   d) a second backward network having one primary input for every primary output of said digital combinational circuit and one primary output for every primary input of said digital combinational circuit, said second backward network receiving second signal values computed in said second forward network for propagating the fault activation objective towards a primary output, both said first and second backward networks independently generating and propagating fault-effect propagation objectives towards one or more of its respective primary outputs;
   e) a first control device for generating said set of control signals corresponding to a target fault, and selecting said target fault one at a time from said specified set of target faults;
   f) means for merging one or more objectives propagated to the primary outputs of said first and second backward network;
   g) comparator device for comparing said first and second sets of primary output signals from each said first and second forward network in response to primary input signals, and determining whether at least one pair of corresponding primary outputs have different binary values and providing an output therefor; and,
   h) second control device for receiving said merged objectives from said backward network and said comparator output, and determining therefrom primary input values of said first and second forward network for detecting said target fault in said combinational digital circuit.

2. Automatic test pattern generator as claimed in claim 1, wherein said second control means further determines the non-existence of primary input values when said target fault is undetectable.

3. Automatic test pattern generator as claimed in claim 1, wherein said computed first signal values are values at digital logic gates in said first forward network and, said second signal values are propagating fault-effect values at digital logic gates in said second forward network.

4. Automatic test pattern generator as claimed in claim 1, wherein said second forward network includes means responsive to said set of control signals for inserting a said target fault in said second forward network.

5. Automatic test pattern generator as claimed in claim 1, wherein said first backward network includes means responsive to said set of control signals for generating said one fault activation objective.

6. Automatic test pattern generator as claimed in claim 1, wherein each said first forward and second forward networks contain emulated digital logic gates capable of processing 3-valued logic.

7. Automatic test pattern generator as claimed in claim 1, wherein said first control device for generating said set of control signals includes means for selecting a stuck-at target fault among a set of stuck-at target faults.

8. Automatic test pattern generator as claimed in claim 1, wherein said first control device for generating said set of control signals includes means for selecting multiple stuck-at target fault among a set of stuck-at target faults.

9. Automatic test pattern generator as claimed in claim 1, wherein said first control device for generating said set of control signals includes means for generating a bridge-type fault in said second forward network.

10. Automatic test pattern generator as claimed in claim 7, wherein said selecting means includes a circular shift-register for sequentially inserting a target fault from said set of target faults.

11. Automatic test pattern generator as claimed in claim 1, wherein one or more objectives propagate concurrently through each said first and second backward emulations, each said objective being represented by an objective flag signal and an objective value signal.

12. Automatic test pattern generator as claimed in claim 1, wherein for every signal line constituting a stem and having one or more fan-out branch lines connected thereto in said digital combinational circuit, said first and second backward networks contain means for computing objectives for said stem from the objectives propagating on its fanout branches.

13. Automatic test pattern generator as claimed in claim 1, further including means for determining whether signal lines in said digital combinational circuit have become dead lines which will no longer influence the value of any primary output, and means for preventing the propagation of objectives on any said dead line.

14. Automatic test pattern generator as claimed in claim 1, wherein said digital circuit contains digital logic gates, each said first and second backward emulations including devices corresponding to said logic gates and connected in such a way that said fault-effect propagation objectives are propagated through said first and second backward emulations in a direction opposite than the propagation direction of said fault-effect values in said first and second forward emulations.

15. Automatic test pattern generator as claimed in claim 1, wherein said generator is created using reconfigurable hardware.

16. Automatic test pattern generator as claimed in claim 1, further including a third control device for generating initial primary output objectives to be used as inputs in said first and second backward network.

17. Automatic test pattern generator as claimed in claim 16, wherein said third control device determines active and inactive primary outputs and generates dead objectives corresponding to inactive primary outputs, and further prevents generation and propagation of objectives in areas of said first and second backward network containing said dead objectives.

18. Automatic test pattern generator as claimed in claim 17, wherein said third control device implements a shift register for initializing one active primary output as a potentially propagating objective in said first and second backward network, and remaining primary outputs as dead objectives.

19. Automatic test pattern generator as claimed in claim 18, whereupon determination of a set of primary input values for said first and second forward networks upon detecting a said target fault, said first control device further inserting additional target faults in said second forward network to enable detection of additional faults by said set of primary input values.

20. Apparatus for solving the satisfiability problem for a digital combinational circuit having a primary output signal Z and primary inputs $x_1, X_2, \ldots, x_n$ said apparatus comprising:

a) a forward network capable of emulating said digital combinational circuit and capable of generating a primary output signal Z using 3-valued logic;

b) a backward network having one primary input associated with each primary output of said forward network and primary outputs associated with every primary input of said digital combinational circuit, said backward network being able to compute objectives for the primary inputs of the said forward network, said objectives having the purpose of setting Z=1 in said combinational circuit; and, c) control device for receiving said primary outputs of said backward network and primary output signal Z and determining therefrom input values $x_1, x_2, \ldots, x_n$ for said forward network that will set Z to value 1 or determining that no such values exist.

21. Apparatus for solving the satisfiability problem as claimed in claim 20, wherein said combinational circuit is a model of a system of boolean equations of the form $$f_1(x_1, x_2, \ldots, x_n) = v_1$$

$$f_2(x_1, x_2, \ldots, x_n) = v_2$$

$$\ldots$$

$$f_p(x_1, x_2, \ldots, x_n) = v_p$$

where each $f_i(x_1, x_2, \ldots, x_n) = v_i$ is a boolean expression and $v_i$ is a binary logic 0 or 1, said circuit further including decoder means receiving each said outputs $f_i$ to determine whether all $f_i$ outputs have their specified binary value $v_i$, and having output signal value Z being the result of said determination.

22. Apparatus for solving the satisfiability problem as claimed in claim 20, wherein said digital combinational circuit is a composite circuit of first and second digital combinational circuits to be compared, said first and second digital circuit having common inputs $x_1, x_2, \ldots, x_n$ and respective output signals $f_1$ and $f_2$, said apparatus further including means for comparing each output signals $f_1$ and $f_2$, and having output signal value Z being the result of said comparison.

* * * * *